United States Patent
Itoh et al.

(10) Patent No.: US 8,007,929 B2
(45) Date of Patent: Aug. 30, 2011

(54) SURFACE COATED CUTTING TOOL

(75) Inventors: Hirotoshi Itoh, Satsumasendai (JP); Takahito Tanibuchi, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 623 days.

(21) Appl. No.: 11/571,813

(22) PCT Filed: Jul. 20, 2005

(86) PCT No.: PCT/JP2005/013278
§ 371 (c)(1),
(2), (4) Date: Oct. 15, 2008

(87) PCT Pub. No.: WO2006/011396
PCT Pub. Date: Feb. 2, 2006

(65) Prior Publication Data
US 2009/0214857 A1    Aug. 27, 2009

(30) Foreign Application Priority Data

Jul. 29, 2004 (JP) ................. 2004-221181
Aug. 27, 2004 (JP) ................. 2004-249293

(51) Int. Cl.
*B32B 9/00* (2006.01)
*C09K 3/14* (2006.01)
*B23P 15/28* (2006.01)

(52) U.S. Cl. .......... 428/701; 428/702; 51/309; 407/119; 408/1 R

(58) Field of Classification Search ........................ None
See application file for complete search history.

(56) References Cited

FOREIGN PATENT DOCUMENTS

| JP | 06-316758 | 11/1994 |
|----|-----------|---------|
| JP | 07-216549 | 8/1995 |
| JP | 10-156606 | 6/1998 |
| JP | 11-140647 | 5/1999 |
| JP | 2000-044370 | 2/2000 |
| JP | 3325987 | 7/2002 |
| JP | 2002-370105 | 12/2002 |
| JP | 2003-025114 | 1/2003 |
| JP | 2003-340610 | 12/2003 |
| WO | WO 99/52662 | 10/1999 |

*Primary Examiner* — Timothy M Speer
(74) *Attorney, Agent, or Firm* — DLA Piper LLP (US)

(57) ABSTRACT

A surface coated cutting tool having, on a surface of a substrate, a hard coating layer including at least an aluminum oxide layer, the surface having a rake face on a main face thereof and a flank on a side face thereof, wherein, when a value calculated by the following equation (I) is a texture coefficient TC of the (HKL) plane of the aluminum oxide layer, a ratio of a texture coefficient $TC_R$ on the rake face to a texture coefficient $TC_F$ on the flank, $TC_F/TC_R$, is in a range of 0.3 to 0.95.

$$TC = \frac{I(HKL)/I_O(HKL)}{1/6 \sum [I(hkl)/I_O(hkl)]} \quad (I)$$

where $I(HKL)$, $I_O(HKL)$ and $\Sigma[I(hkl)/I_O(hkl)]$ are as described in the specification.

28 Claims, 2 Drawing Sheets

SURFACE COATED CUTTING TOOL

TECHNICAL FIELD

The present invention relates to a cutting tool with a hard coating layer adhered to a surface thereof, having superior cutting characteristics such as fracture resistance and wear resistance.

BACKGROUND ART

Conventionally, as a surface coated cutting tool having a hard coating layer adhered to a surface of a substrate, tools in which a single or a multilayer of hard coating layers, such as a TiC layer, a TiN layer, a TiCN layer, an $Al_2O_3$ layer, or a TiAlN layer, are adhered to a surface of a hard substrate such as cemented carbide, cermet, or ceramics, have been used for various applications.

Recently, along with the requirement for higher efficiency of cutting process, further improvements in fracture resistance and wear resistance are required. Especially, cutting by which a cutting edge is subject to a large impact, for example, heavy interrupted cutting of metal, is increasing. The conventional cutting tools, however, have the following problem. That is, under the severe cutting conditions, the hard coating layer fails to endure the large impact, so that chipping or peeling of the hard coating layer are apt to occur, which may trigger accidental damage on the tool, such as the fracture of its cutting edge and the occurrence of abnormal wearing, making it impossible to improve the tool life.

With this in view, patent literature 1 describes that an aluminium oxide layer being dense and having high fracture resistance is attainable by optimizing the particle size and the layer thickness of an aluminum oxide layer, and setting the orientation coefficient (texture coefficient) on the (012) plane to 1.3 or more.

Patent literature 2 describes that setting the orientation coefficient (texture coefficient) on the (012) plane to 2.5 or more facilitates release of the residual stress of the aluminium oxide layer, enabling the fracture resistance of the aluminium oxide layer to be improved.

With the methods of improving entirely the fracture resistance of the aluminium oxide layer, namely improving the toughness of the aluminium oxide layer, as described in the above-mentioned patent literature 1 and patent literature 2, it is possible to prevent the tool damage on the rake face particularly apt to cause accidental fracture, chipping, and the like. In contrast, on the flank, a reduction in the hardness of the aluminium oxide layer facilitates to propagate abrasive wear due to the contact with a work material. As the result, there is a limit to the tool life.

On the other hand, patent literature 3 describes that the peak on the (110) plane is maximized in the X-ray peak of X-ray diffraction analysis of the aluminium oxide layer, in order to improve the adhesion of the aluminium oxide layer.

Patent literature 4 describes that the fracture resistance of the aluminium oxide layer can be improved by optimizing the peak of the (012) plane, the (104) plane, the (110) plane, and the (116) plane in the X-ray peak of X-ray diffraction analysis of the aluminium oxide layer.

With the methods of improving the adhesion of the aluminium oxide layer as described in the above-mentioned patent literature 3 and patent literature 4, the propagation of layer peeling and wear can be prevented. However, the adhesion of the aluminium oxide layer on the rake face is too high, and hence the underlying hard layer may flake early. Therefore, if a large impact is exerted, an accidental large fracture might be generated. Whereas on the flank, if a crack occurs in the aluminium oxide layer, a dissolved work material enters into the crack, facilitating adhesion of the work material. As the result, there is a limit to the tool life.

Patent literature 1: Japanese Patent No. 3325987
Patent literature 2: Japanese Unexamined Patent Publication No. 2003-025114
Patent literature 3: Japanese Unexamined Patent Publication No. 10-156606
Patent literature 4: Japanese Unexamined Patent Publication No. 2002-370105

DISCLOSURE OF THE INVENTION

Problems to be Solved by the Invention

A main object of the present invention is to provide a long-life surface coated cutting tool by optimizing the characteristic balance of a hard coating layer to achieve a surface coated cutting tool superior in both wear resistance and fracture resistance.

Other object of the present invention is to provide a long-life surface coated cutting tool by increasing the impact resistance of its rake face so as to prevent any accidental large fracture, and preventing adhesion of a work material on its flank.

Still other object of the present invention is to provide a method of manufacturing a work piece which can obtain a work piece having stable and good machined surface.

Methods for Solving the Problems

The present inventors have examined intensively to solve the above-mentioned problems, and have found out means for solving comprised of the following constructions, thereby completing the present invention.

(1) A surface coated cutting tool with a hard coating layer including at least an aluminium oxide layer formed on a surface of a substrate, the surface having a rake face on a main face thereof and a flank on a side face thereof, wherein, when a value calculated by the following equation (I) is a texture coefficient TC of an (HKL) plane of the aluminium oxide layer, a ratio of a texture coefficient $TC_R$ on the rake face to a texture coefficient $TC_F$ on the flank, $TC_F/TC_R$, is in a range of 0.3 to 0.95.

$$TC = \frac{I(HKL)/I_0(HKL)}{1/6 \sum [I(hkl)/I_0(hkl)]} \qquad (I)$$

where,
(HKL) plane is one selected from (012), (104), (110), (113), (024), and (116) planes;
I(HKL) is a measured value of an X-ray diffraction peak on the (HKL) plane;
$I_0$(HKL) is a standard X-ray diffraction peak on the (HKL) plane of a JCPDS card number 10-173; and
$\Sigma[I(hkl)/I_0(hkl)]$ is a sum of values of [Measured value of X-ray diffraction peak]/[Standard X-ray diffraction peak] on the (012), (104), (110), (113), (024), and (116) planes.

(2) The surface coated cutting tool as set forth in the item (1), wherein the (HKL) plane is (012) plane.

(3) The surface coated cutting tool as set forth in the item (2), wherein a texture coefficient $TC_R$ on the rake face is 1.2 to 2.5, and a texture coefficient $TC_F$ on the flank is 0.5 to 1.1.

(4) The surface coated cutting tool as set forth in the item (2), wherein the surface of the substrate has a surface roughness of 0.1 μm or less on the rake face, and a surface roughness of 0.2 to 1.0 μm on the flank.

(5) The surface coated cutting tool as set forth in the item (2), wherein a bonding layer composed of a compound containing at least titanium and oxygen is provided immediately below the aluminium oxide layer.

(6) The surface coated cutting tool as set forth in the item (5), wherein the bonding layer has an oxygen concentration of 2 to 10 atomic %.

(7) The surface coated cutting tool as set forth in the item (5), wherein an interface between the aluminium oxide layer and the bonding layer has a surface roughness of 0.08 μm or less on the rake face, and a surface roughness of 0.1 to 0.8 μm on the flank.

(8) The surface coated cutting tool as set forth in the item (2), wherein a layer hardness of the aluminium oxide layer measured with a micro Vickers hardness testing machine is 20 GPa or more on the rake face, and a layer hardness of the aluminium oxide layer on the flank is 0.5 GPa greater than a layer hardness on the rake face.

(9) The surface coated cutting tool as set forth in the item (1), wherein the (HKL) plane is (110) plane.

(10) The surface coated cutting tool as set forth in the item (9), wherein a texture coefficient $TC_R$ on the rake face is 1.3 to 5.0, and a texture coefficient $TC_F$ on the flank is 0.5 to 4.0.

(11) The surface coated cutting tool as set forth in the item (9), wherein the surface of the substrate has a surface roughness of 0.2 to 1 μm on the rake face, and a surface roughness of 0.6 to 2 μm on the flank.

(12) The surface coated cutting tool as set forth in the item (9), wherein a bonding layer composed of a compound containing at least titanium and oxygen is provided immediately below the aluminium oxide layer.

(13) The surface coated cutting tool as set forth in the item (12), wherein the bonding layer has an oxygen concentration of 10 to 25 atomic %.

(14) The surface coated cutting tool as set forth in the item (12), wherein an interface between the aluminium oxide layer and the bonding layer has a surface roughness of 0.2 to 0.5 μm on the rake face, and a surface roughness of 0.6 to 2 μm on the flank.

(15) The surface coated cutting tool as set forth in the item (9), wherein adhesion of the aluminium oxide layer determined by a scratch test with a diamond indenter is in a range of 40 N to 120 N on the rake face, and adhesion of the aluminium oxide layer on the flank is in a range of 30 N to 100 N.

(16) The surface coated cutting tool as set forth in the item (1), wherein the (HKL) plane is (113) plane.

(17) The surface coated cutting tool as set forth in the item (16), wherein a texture coefficient $TC_R$ on the rake face is 0.4 to 1.0, and a texture coefficient $TC_F$ on the flank is 0.2 to 0.7.

(18) The surface coated cutting tool as set forth in the item (16), wherein a bonding layer composed of a compound containing at least titanium and oxygen is provided immediately below the aluminium oxide layer.

(19) The surface coated cutting tool as set forth in the item (18), wherein the bonding layer has an oxygen concentration of 25 to 40 atomic %.

(20) The surface coated cutting tool as set forth in the item (1), wherein a ratio of a texture coefficient $TC_E$ on the (HKL) plane in a cutting edge formed at a crossed ridge line part between the rake face and the flank, to a texture coefficient $TC_F$ on the flank, $TC_F/TC_E$, is in a range of 0.2 to 0.8.

(21) The surface coated cutting tool as set forth in the item (1), wherein the aluminium oxide layer has a layer thickness of 1 to 6 μm.

(22) A method of manufacturing a work piece in which a cutting process is performed by applying, to a work material, a cutting edge formed at a crossed ridge line part between the rake face and the flank of the surface coated cutting tool as set forth in the item (1).

(23) The method of manufacturing a work piece as set forth in the item (22), wherein the cutting process includes a continuous cutting process step and an interrupted cutting process step.

(24) The method of manufacturing a work piece as set forth in the item (23), wherein a cutting process is performed with the surface coated cutting tool as set forth in the item (2).

(25) The method of manufacturing a work piece as set forth in the item (22), wherein the cutting process includes an interrupted cutting process step.

(26) The method of manufacturing a work piece as set forth in the item (25), wherein a cutting process is performed with the surface coated cutting tool as set forth in the item (9).

(27) The method of manufacturing a work piece as set forth in the item (22), wherein the cutting process includes a high-speed continuous cutting process step.

(28) The method of manufacturing a work piece as set forth in the item (27), wherein a cutting process is performed with the surface coated cutting tool as set forth in the item (16).

Effects of the Invention

In the above item (1) or (2), the texture coefficient of the (012) plane of the aluminium oxide layer formed on the surface of the substrate is adjusted so that the ratio of a texture coefficient $TC_R$ on the rake face to a texture coefficient $TC_F$ on the flank, $TC_F/TC_R$, is in a range of 0.3 to 0.95. This enables to prevent chipping and accidental fracture by increasing the impact resistance of the cutting tool on the rake face that is apt to get impacted by cutting in a work material during the cutting process. Additionally, on the flank subjected to a large amount of wear due to abrasive wear with the work material during the cutting process, the hardness of the aluminium oxide layer can be increased to improve the wear resistance of the flank. This results in the surface coated cutting tool exhibiting superior performance in both wear resistance and fracture resistance.

Hence, there is the effect of exhibiting superior wear resistance without any accidental fracture particularly in a mixed process of the interrupted process in which the cutting edge is subjected to a large impact, and the continuous process for which wear resistance is important.

In the above item (3), the adherence between crystals in the aluminium oxide layer on the flank can be increased to sufficiently enhance the layer hardness thereby to prevent abrasive wear on the flank. Further, the adherence between crystals in the aluminium oxide layer on the rake face can be lowered to increase the toughness of the aluminium oxide layer thereby to prevent chipping and accidental fracture on the rake face. It is therefore capable of improving both of fracture resistance and wear resistance.

In the above item (4), it is easy to adjust the texture coefficients on the rake face and the flank to a predetermined range, enabling to improve both of fracture resistance and wear resistance of the surface coated cutting tool.

In the above item (5), the adhesion of the aluminium oxide layer can be increased to prevent layer peeling during the cutting process, and the texture coefficient of the aluminium oxide layer can be adjusted easily to a predetermined range.

In the above item (6), it is easy to control the texture coefficient of the aluminium oxide layer.

In the above item (7), the ratio of the texture coefficient of the aluminium oxide layer on the rake face to that on the flank can be controlled easily to a stipulated range, thereby achieving the surface coated cutting tool free from variations in performance.

In the above item (8), the wear resistance of the aluminium oxide layer on the flank can be increased to prevent wear on the flank, and the toughness of the aluminium oxide layer on the rake face can be retained thereby to improve the impact resistance.

In the above item (9), the texture coefficient of the (110) plane of the aluminium oxide layer formed on the surface of the substrate is adjusted so that the ratio of a texture coefficient $TC_R$ on the rake face to a texture coefficient $TC_F$ on the flank, $TC_F/TC_R$, is in the range of 0.3 to 0.95. This enables to increase the toughness of the rake face that is apt to get impacted by cutting in a work material during the cutting process, thus preventing any accidental large fracture. Additionally, on the flank subjected to a large amount of wear due to abrasive wear with the work material during the cutting process, the hardness of the aluminium oxide layer can be increased to reduce fine cracks generated in the flank, permitting a reduction in the adhesion of the work material. This results in the surface coated cutting tool of high reliability, exhibiting stable cutting performance without any accidental disadvantage over a long time.

In the above item (10), any crack is hard to occur in the aluminium oxide layer on the flank, and hence it is capable of preventing a work material from entering into the crack, preventing the adhesion of the work material. Additionally, on the rake face that is apt to get impacted by cutting, the residual stress can be further reduced by fine cracks generated in the aluminium oxide, enabling any accidental large fracture to be prevented. Furthermore, on the rake face, the adhesion of the aluminium oxide layer can be increased to prevent layer peeling, so that the toughness of the aluminium oxide layer can be increased to prevent chipping and accidental fracture on the rake face. It is therefore capable of improving both of fracture resistance and wear resistance.

In the above item (11), it is easy to adjust the texture coefficients on the rake face and the flank to a predetermined range, enabling to improve both of fracture resistance and wear resistance in the surface coated cutting tool.

In the above item (12), the adhesion of the aluminium oxide layer can be increased to prevent layer peeling during the cutting process, and the texture coefficient of the aluminium oxide layer can be adjusted easily to a predetermined range.

In the above item (13) or (14), the ratio of the texture coefficient of the aluminium oxide layer on the rake face to that on the flank can be adjusted easily to a predetermined range, thereby achieving the surface coated cutting tool free from variations in performance.

In the above item (15), no layer peeling occurs during the continuous cutting requiring wear resistance, and it is possible to retain proper adhesion by which it is capable of avoiding any layer peeling convolve the underlayer of the aluminium oxide layer during the interrupted cutting process subjected to strong impact.

In the above item (16), the rake face is susceptible to slight decomposition than the flank, enabling the aluminium oxide layer on the rake face to have a smaller particle size and an improved hardness. This improves the wear resistance on the rake face, and also improves the toughness of the aluminium oxide layer, so that the fracture resistance on the rake face subjected to a large impact can be increased to prevent the occurrence of large chipping and fracture. Further, by decreasing the surface energy on the flank, the wettability of the flank can be lowered to prevent the work material from adhering to the flank. As the result, it is possible to prevent both of crater wear on the rake face, and a degradation in machined surface quality due to the adhesion of the work material on the flank, which become problems in the high-speed continuous cutting process.

In the above item (17), the crater wear on the rake face can be prevented more effectively.

In the above item (18), the crystalline structure of the aluminium oxide layer can be controlled to α (alpha)-aluminium oxide structure.

In the above item (19), it is easy to control the texture coefficient of the aluminium oxide layer.

In the above item (20), the adherence between crystals of the aluminium oxide layer in the cutting edge can be optimized to increase the impact resistance of the cutting edge. Hence, any accidental fracture and chipping from the cutting edge can be prevented to achieve high wear resistance.

In the above item (21), any layer peeling can be prevented while maintaining wear resistance.

In the above item (22), it becomes possible to obtain a work piece having stable and good machined surface.

In the above item (23) or (24), by adapting so that the rake face has high toughness than the flank, it is possible to improve the fracture resistance on the rake face that is susceptible to a larger impact during the interrupted cutting, and prevent the wear on the flank that is apt to wear during the continuous cutting.

In the above item (25) or (26), by adapting so that the rake face has more fine cracks than the flank, it is possible to improve the fracture resistance on the rake face that is susceptible to a larger impact during the interrupted cutting, and prevent the adhesion on the flank.

In the above item (27) or (28), by adapting so that the rake face is susceptible to slight decomposition than the flank, the aluminium oxide layer on the rake face has a smaller particle size, thus improving hardness and toughness. Further, the surface energy of the aluminium oxide layer on the flank can be reduced to prevent the adhesion of the work material. Hence, it is possible to prevent the crater wear on the rake face, and the adhesion of the work material on the flank, which are liable to become problems in the high-speed continuous cutting process at a cutting speed of 200 m or more.

DESCRIPTION OF REFERENCE NUMERALS

Figure 1:
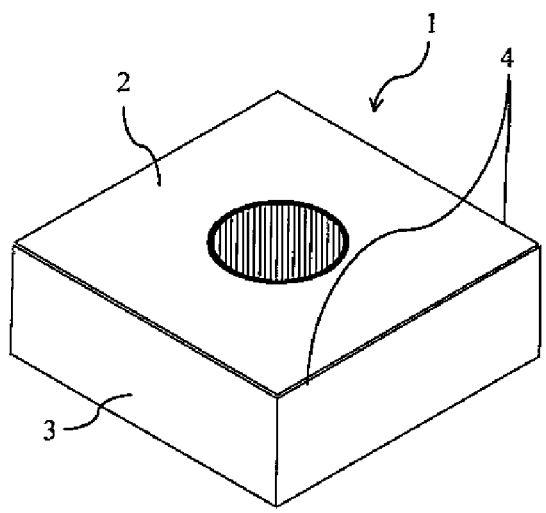
FIG. 1 is a schematic view showing an appearance of a surface coated cutting tool of the present invention.

Reference numeral 1 denotes a surface coated cutting tool;
Reference numeral 2 denotes a rake face;
Reference numeral 3 denotes a flank;
Reference numeral 4 denotes a cutting edge;
Reference numeral 5 denotes a substrate;
Reference numeral 6 denotes a hard coating layer;
Reference numeral 7 denotes an aluminium oxide layer;
Reference numeral 8 denotes a bonding layer;

Reference numeral 9 denotes an interface;
Reference numeral 9b denotes an interface between the substrate and the hard coating layer;
Reference numeral 9c denotes an interface between the bonding layer and the aluminium oxide layer;
Reference numeral 10 denotes an underlayer; and
Reference numeral 11 denotes the uppermost surface layer.

PREFERRED MODE FOR CARRYING OUT THE INVENTION

<Surface Coated Cutting Tool>

First Preferred Embodiment

Figure 2:
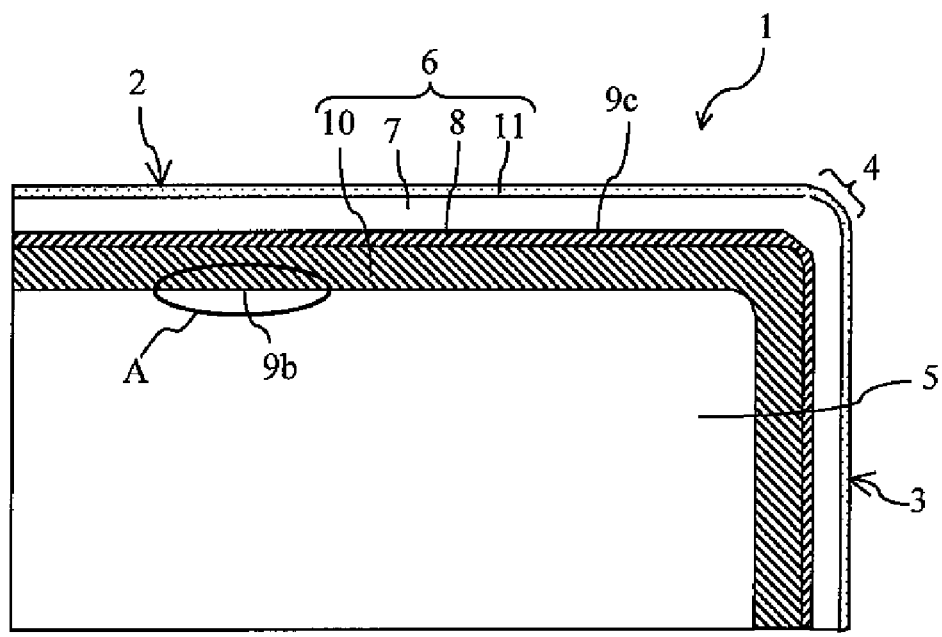
FIG. 2 is a cross section view showing an example of the layer construction of a surface coated cutting tool of the present invention.

A first preferred embodiment of a surface coated cutting tool (hereinafter referred to simply as a "tool") of the present invention will be described in detail with reference to the accompanying drawings. FIG. 1 is a schematic perspective view showing a tool of the present embodiment. FIG. 2 is a schematic sectional view showing the tool of the present embodiment.

As shown in the figures, a tool 1 has a rake face 2 on a main face thereof, and a flank 3 on a side face thereof. A hard coating layer 6 is coated on the surface of a substrate 5 having a cutting edge 4 on a crossed ridge line between the rake face 2 and the flank 3.

The present embodiment has the following characteristic features. That is, the surface of the substrate 5 is provided with at least an aluminium oxide ($Al_2O_3$) layer 7 as the hard coating layer 6, and on a (HKL) plane of the aluminium oxide layer 7, the peak of a (012) plane is the highest. Specifically, the (HKL) plane in the above-mentioned equation (I) is the (012) plane, and in a texture coefficient that can be calculated by substituting, in the equation (I), an X-ray diffraction strength value on the (012) plane of the aluminium oxide layer 7 which is measured by X-ray diffraction method (XRD), a ratio of a texture coefficient $TC_R$ on the rake face 2 to a texture coefficient $TC_F$ on the flank 3, $TC_F/TC_R$, is in a range of 0.3 to 0.95.

For reference, the term "JCPDS card" in the equation (I) means a data file of powder X-ray diffraction of chemical substances issued from "Joint Committee on Powder Diffraction Standards."

Thus, it is capable of increasing the impact resistance of the cutting tool 1 on the rake face 2 that is apt to get impacted by cutting in a work material during the cutting, thereby preventing chipping and accidental fracture. Also, on the flank 3 subjected to a large amount of wear due to abrasive wear with the work material during the cutting, the hardness of the aluminium oxide layer 7 can be increased to improve the wear resistance of the flank 3. This results in the tool 1 exhibiting superior performance in both wear resistance and fracture resistance.

That is, increasing the texture coefficient on the (012) plane of the aluminium oxide layer 7 produces the effects that the adherence between crystals in the aluminium oxide layer 7 can be lowered to improve the toughness of the aluminium oxide layer 7, and that the strength against impact on the rake face 2 of the tool 1 can be increased. It is therefore capable of preventing the layer peeling due to impact during the cutting process, any accidental fracture due to destruction, and a reduction in tool life due to abnormal wear. In contrast, a small texture coefficient on the (012) plane of the aluminium oxide layer 7 increases the adherence between crystals in the aluminium oxide layer 7, and increases the hardness of the aluminium oxide layer 7. This increases the wear resistance on the flank 3 of the tool 1, thereby exhibiting superior tool life in the cutting process, as a whole of the tool. The desirable range of the ratio $TC_F/TC_R$ is 0.3 to 0.8, more desirably 0.5 to 0.85, especially 0.5 to 0.8.

In the present embodiment, the crystalline structure of the aluminium oxide layer 7 is preferably composed of aluminium oxide having α (alpha)crystalline structure, because it has high oxidation resistance and wear resistance, and is hard to react with a work material, thereby increasing a cutting tool life.

An α (alpha)-aluminium oxide layer is used to determine the texture coefficient on the (012) plane of the aluminium oxide layer 7 in the present embodiment.

Alternatively, instead of the crystalline structure of the α (alpha)-aluminium oxide layer, the aluminium oxide layer 7 may be of the construction that other crystalline structure such as κ (kappa) type, θ (theta) type, or γ (gamma) type is mixed at a ratio of strength lower than the highest of the X-ray diffraction peak of the α (alpha)-aluminium oxide layer. Even for this case, in determining the texture coefficient TC of the aluminium oxide layer 7, the texture coefficient on the (012) plane can be calculated only by the peak of the a (alpha)-aluminium oxide layer.

In order that the impact resistance of the aluminium oxide layer 7 on the rake face 2 side can be increased to improve the fracture resistance, the texture coefficient $TC_R$ of the aluminium oxide layer 7 on the rake face 2 is preferably 1.2 to 2.5, especially 1.2 to 2.0. Also, in order to achieve excellent wear resistance on the flank 3 side, the texture coefficient $TC_F$ of the aluminium oxide layer 7 on the flank 3 side is preferably 0.5 to 1.1, especially 0.75 to 1.1.

Further, the ratio of a texture coefficient $TC_E$ to a texture coefficient $TC_F$ on the (012) plane in the cutting edge 4, $TC_F/TC_E$, is preferably in a range of 0.2 to 0.8, especially 0.4 to 0.7, because the impact resistance of the cutting edge 4 can be increased to prevent the accidental fracture and chipping from the cutting edge 4, and at the same time, excellent wear resistance can be achieved.

The layer thickness of the aluminium oxide layer 7 is preferably set to 1 to 6 μm, especially 2 to 4 μm, because layer peeling can be prevented while retaining wear resistance, and it is easy to adjust the texture coefficient to the set range in the present embodiment.

Furthermore, the surface roughness of an interface 9b between the substrate 5 and the hard coating layer 6 is desirably 0.1 μm or less on the rake face 2, and 0.2 to 1.0 μm, preferably 0.2 to 0.5 μm on the flank 3. This is because the texture coefficients of the aluminium oxide layer 7 on the rake face 2 and on the flank 3 can be adjusted easily to a defined range, and the variations in the texture coefficient in each part of the tool 1 can be prevented to obtain the tool 1 free from variations in performance.

Figure 3:
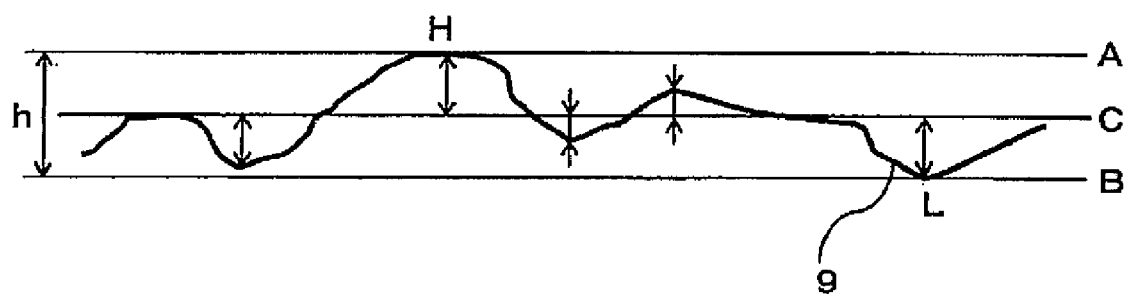
FIG. 3 is an enlarged view of a site A in FIG. 2, and also a schematic diagram for explaining a method of measuring surface roughness in the present invention.

A method of measuring the surface roughness on the interface 9 (9b) will now be described in detail with reference to FIG. 3. FIG. 3 is an enlarged view of a site A in FIG. 2, and also a schematic diagram for explaining the method of measuring the surface roughness in the present invention. First, a cut surface or a fracture surface of the tool 1 is observed at magnifications of ×5000 to ×20000 with a scanning electron microscope (SEM). In the cut surface or the fracture surface, A is a line passing through the highest convex portion H on the interface 9 between the substrate 5 and the hard coating layer 6, and being substantially parallel to the substrate 5; B is a line passing through the deepest concave portion L on the interface 9 and being substantially parallel to the substrate 5; and a reference line C is a line passing through a midpoint of the shortest distance h between the above two lines, and being parallel to the substrate 5. In the concave and convex portions on the interface 9, one projecting above the reference line C is a convex portion, and one recessed below the reference line C is a concave portion. The shortest distance from the reference line C to the uppermost point of the convex portion, and that to the lowermost point of the concave portion are measured, respectively, and the average distance thereof is calculated as a surface roughness.

Preferably, a bonding layer 8 composed of a compound containing at least titanium and oxygen is provided immediately below the aluminium oxide layer 7, because the texture coefficient of the aluminium oxide layer 7 can be adjusted easily by adjusting the condition of the bonding layer 8. Also, the adhesion of the aluminium oxide layer 7 can be increased to prevent layer peeling.

Preferably, the bonding layer 8 has an oxygen concentration of 2 to 10 atomic %. This makes it easy to adjust the ratio of the texture coefficient of the aluminium oxide layer 7 to a predetermined range, resulting in the tool 1 free from variations in performance.

Preferably, the interface 9c between the aluminium oxide layer 7 and the bonding layer 8 has a surface roughness of 0.08 μm or less on the rake face 2, and a surface roughness of 0.1 μm to 0.8 μm, especially 0.2 μm to 0.8 μm, on the flank 3, because the ratio of the texture coefficient of the aluminium oxide layer 7 can be adjusted easily to the above-mentioned range, resulting in the tool 1 free from variations in performance. The surface roughness of the interface 9c is measured in the same manner as the above-mentioned method of measuring the interface 9b between the substrate 5 and the hard coating layer 6.

Under the bonding layer 8, it is possible to use, as an underlayer 10, a hard layer composed of at least one selected from one metal of the groups 4a, 5a, and 6a metals in the periodic table, Si, and Al, or two or more intermetallic compounds of carbide, nitride, oxide, carbonitride, carboxide, nitroxide, and carbonitroxide. Among others, it is desirable to form a single layer or multilayer of a compound selected from carbide, nitride, oxide, carbonitride, carboxide, nitroxide, and carbonitroxide of titanium, because higher wear resistance and fracture resistance can be obtained. Particularly, it is desirable to form a titanium carbonitride layer superior in layer hardness and strength, because both of wear resistance and fracture resistance can be improved.

Preferably, as an uppermost surface layer 11 of the tool 1, a layer composed of titanium nitride having golden color is formed in a layer thickness of 0.1 to 2 μm. This produces the effect that when the tool 1 is used, the used cutting edge 4 is discolored by wear and layer peeling, thereby facilitating to ascertain whether the cutting edge 4 has been used or not.

As the substrate 5 used in the present invention, there can be used cemented carbide or cermet in which tungsten carbide (WC), titanium carbide (TiC), or titanium carbonitride (TiCN), and, as required, in which a hard phase compose of at least one selected from the group consisting of carbide, nitride, and carbonitride of the groups 4a, 5a, and 6a metals in the periodic table are bonded by a binder phase composed of iron family metal of cobalt (Co) and/or nickel (Ni), or hard material such as ceramic sintered body of silicon nitride ($Si_3N_4$) or aluminium oxide ($Al_2O_3$), cubic boron nitride (cBN), super high pressure sintered body composed mainly of diamond, or very hard material of metal or the like such as carbon steel, high-speed steel, or alloy steel. In FIG. 1, there is used cemented carbide constructed of a hard phase composed mainly of tungsten carbide (WC) and a binder phase composed of cobalt (Co).

In the present embodiment, it is preferable that the layer hardness of the aluminium oxide layer 7 on the rake face 2, which can be measured by a micro Vickers hardness testing machine, is 20 GPa or more, and the layer hardness of the aluminium oxide layer 7 on the flank 3 is 0.5 GPa greater or more than the layer hardness of the aluminium oxide layer 7 on the rake face 2. This is because the wear resistance of the aluminium oxide layer 7 on the flank 3 can be increased, and the impact resistance on the rake face 2 can be increased to retain wear resistance, thereby preventing the wear resistance of the rake face 2 from being lowered.

A method of manufacturing the surface coated cutting tool according to the foregoing preferred embodiment will be described below. First, metal powder, carbon powder, or the like are suitably added to and mixed with inorganic powder such as metal carbide, nitride, carbonitride, oxide, which can form the above-mentioned cemented carbide by sintering. Subsequently, with a known molding method such as press molding, slip casting, extrusion, or cold isostatic pressing, this mixture is then pressed in a predetermined tool shape, followed by sintering in vacuum or nonoxidizing atmosphere, thereby manufacturing a substrate 5 composed of the above-mentioned cemented carbide.

In the present embodiment, it is necessary to adjust the surface roughness immediately below the aluminium oxide layer 7 in order to adjust the texture coefficient on the (012) plane of the aluminium oxide layer 7. As a method thereof, first, the surface of the rake face 2 of the substrate 5 is subjected to polishing process with elastic grinding stone, brush, lap, blast process, or the like. Subsequently, a polish process is separately performed with the above-mentioned method, in order to control so that the surface roughness of the rake face 2 observed on the substrate cross section is smoothed to 0.1 μm or less, and the surface roughness of the flank 3 is 0.2 to 1 μm.

Next, a hard coating layer 6 is deposited on the surface of the substrate 5 by chemical vapor deposition (CVD) method, for example. First, an underlayer 10 is deposited. To deposit a titanium nitride (TiN) layer as the underlayer 10, there may be prepared, as a reaction gas composition, a mixed gas consisting of 0.1 to 10 vol. % of titanium tetrachloride ($TiCl_4$) gas, 0 to 60 vol. % of nitrogen ($N_2$) gas, and the rest, namely hydrogen ($H_2$) gas. This mixed gas is then introduced into a reactor with the interior of the reactor set at 800 to 1000° C. and 5 to 85 kPa.

Further, to form a titanium carbonitride layer as the underlayer 10, for example, there may be prepared, as a reaction gas composition, a mixed gas consisting of 0.1 to 10 vol. % of titanium tetrachloride ($TiCl_4$) gas, 0 to 60 vol. % of nitrogen ($N_2$) gas, 0 to 0.1 vol. % of methane ($CH_4$) gas, 0.1 to 3 vol. % of acetonitrile ($CH_3CN$) gas, and the rest, namely hydrogen ($H_2$) gas. This mixed gas is then introduced into the reactor with the interior of the reactor set at temperature of 800 to 1100° C. and 5 to 85 kPa.

Alternatively, to form a titanium carbide (TiC) layer as the underlayer 10, there is prepared, as a reaction gas composition, a mixed gas consisting of 0.1 to 30 vol. % of $TiCl_4$ gas, 0.1 to 20 vol. % of $CH_4$ gas, and the rest, namely $H_2$ gas. This mixed gas is then infused into the reactor with the interior of the reactor set at temperature of 800 to 1100° C. and 5 to 85 kPa.

Subsequently, the above-mentioned bonding layer 8 is deposited on the surface of the underlayer 10, namely immediately below the aluminium oxide layer 7. For example, when forming a titanium carbonitroxide (TiCNO) layer as the underlayer 10, there is prepared a mixed gas consisting of 0.1 to 3 vol. % of titanium tetrachloride ($TiCl_4$) gas, 0.1 to 10 vol.

% of methane ($CH_4$) gas, 0 to 60 vol. % of nitrogen ($N_2$) gas, carbon dioxide ($CO_2$) gas, and the rest, namely hydrogen ($H_2$) gas. This mixed gas is then introduced into the reactor with the interior of the reactor set at temperature of 800 to 1100° C. and 5 to 85 kPa. In the present invention, in order to control the texture coefficient TC on the rake face 2 and the flank 3 of the tool 1 to a predetermined range, it is especially effective to set the $CO_2$ gas in the reaction gas for coating the bonding layer 8, to 0.3 to 1.2 vol. %.

Thereafter, an aluminium oxide layer 7 is deposited on the surface of the bonding layer 8. As a method of coating the aluminium oxide layer 7, it is desirable to perform layer formation at 900 to 1100° C. and 5 to 10 kPa, with the use of a mixed gas consisting of 3 to 20 vol. % of aluminum trichloride ($AlCl_3$) gas, 0.5 to 3.5 vol. % of hydrogen chloride (HCl) gas, 0.01 to 5.0 vol. % of carbon dioxide ($CO_2$) gas, 0 to 0.01 vol. % of hydrogen sulfide ($H_2S$) gas, and the rest, namely hydrogen ($H_2$) gas.

Further, if desired, a TiN layer may be deposited on the uppermost surface under the above-mentioned conditions, in order to facilitates to ascertain whether the cutting edge has been used or not.

Second Preferred Embodiment

A second preferred embodiment of the surface coated cutting tool of the present invention will be described. In this embodiment, the same reference numerals have been used as in the above-mentioned first preferred embodiment for identical or similar components, with the description thereof omitted.

The present embodiment has the following characteristic features. That is, the surface of the substrate 5 is provided with at least an aluminium oxide ($Al_2O_3$) layer 7 as a hard coating layer 6, and on the (HKL) plane of the aluminium oxide layer 7, the peak of a (110) plane is the highest. Specifically, the (HKL) plane in the above-mentioned equation (I) is the (110) plane, and in a texture coefficient that can be calculated by substituting, in the equation (I), an X-ray diffraction strength value measured by X-ray diffraction method (XRD) on the (110) plane of the aluminium oxide layer 7, a ratio of a texture coefficient $TC_R$ on a rake face 2 to a texture coefficient $TC_F$ on a flank 3, $TC_F/TC_R$, is in a range of 0.3 to 0.95.

With this construction, the adhesion and the possibility of occurrence of fine cracks in the aluminium oxide layer 7 on the rake face 2 and the flank 3 can be adjusted to the optimum state, enabling cutting performance to be enhanced.

That is, on the rake face 2 apt to get impacted by cutting in a work material during cutting, the peak on the (110) plane is set somewhat higher so that fine cracks are easy to occur, and the residual stress can be released to increase impact resistance, thereby preventing occurrence of any large accidental fracture. On the other hand, on the flank 3 susceptible to adhesion of a work material by the contact with the work material, the peak on the (110) plane of the aluminium oxide layer 7 is set low in order to prevent fine cracks from occurring in the aluminium oxide layer 7, thereby preventing the work material from entering into the fine cracks and then adhering. This results in the tool 1 capable of performing stable cutting process and exhibiting superior performance in reliability.

That is, when the texture coefficient on the (110) plane of the aluminium oxide layer 7 is increased, the adherence between crystals in the aluminium oxide layer 7 can be lowered, and there is a possibility that the aluminium oxide layer 7 is susceptible to cracks.

Accordingly, in the present embodiment, the aluminium oxide layer 7 on the rake face 2 side is adapted to have a strong texture coefficient on the (110) plane in order to generate fine cracks in the aluminium oxide layer 7, and the residual stress in the aluminium oxide layer 7 is released to improve the layer toughness. This can prevent the tool life from being shortened due to accidental large fracture against a impact on the rake face 2 of the tool 1. On the other hand, the texture coefficient $TC_F$ on the (110) plane of the aluminium oxide layer 7 on the flank 3 is decreased so as to increase the adherence between crystals of the aluminium oxide layer 7, thereby preventing fine cracks from occurring in the aluminium oxide layer 7. Hence, it is possible to prevent the work material from entering into the fine cracks and then adhering, thereby preventing the wear due to adhesion. As the result, the tool 1 as a whole can exhibit superior tool life in the cutting process. A particularly desirable range of the ratio $TC_F/TC_R$ is 0.5 to 0.85.

In the present embodiment, the crystalline structure of the aluminium oxide layer 7 is preferably composed of a (alpha)-aluminium oxide because it has high oxidation resistance and is hard to react with an work material, and also exhibits superior wear resistance against wear by chemical reaction.

Therefore, an α (alpha)-aluminium oxide layer is used for determining the texture coefficient on the (110) plane of the aluminium oxide layer 7 in the present embodiment.

Alternatively, instead of the crystalline structure of the α (alpha)-aluminium oxide layer, the aluminium oxide layer 7 may be of the construction that other crystalline structure, such as κ (kappa) type, θ (theta) type, or γ (gamma) type, is mixed at a ratio of strength lower than the highest peak of the X-ray diffraction peak of the α (alpha)-aluminium oxide layer. Even for this case, in determining the texture coefficient TC of the aluminium oxide layer 7, the texture coefficient on the (110) plane is calculated only by the peak of the α (alpha)-aluminium oxide layer.

Here, the texture coefficient $TC_R$ of the aluminium oxide layer 7 on the rake face 2 is 1.3 to 5.0, preferably 1.3 to 4.0, and the texture coefficient $TC_F$ on the flank 3 is 0.5 to 4.0, preferably 0.75 to 3.0. Thus, any crack is hard to occur in the aluminium oxide layer 7 on the flank 3, and hence it is possible to prevent the work material from entering into the crack, and prevent the adhesion of the work material. Additionally, on the rake face 2 apt to get impacted by cutting, by the presence of the fine cracks developed in the aluminium oxide layer 7, the residual stress can be further reduced to prevent any accidental large fracture. Further, by increasing the adhesion of the aluminium oxide layer 7 on the rake face 2 so as to prevent layer peeling, the roughness of the aluminium oxide layer 7 can be increased to prevent chipping and accidental fracture on the rake face 2. As the result, both of fracture resistance and wear resistance can be improved.

Further, the ratio of a texture coefficient $TC_E$ to a texture coefficient $TC_F$ on the (110) plane in a cutting edge 4, $TC_F/TC_E$, is preferably in a range of 0.2 to 0.8, especially 0.4 to 0.7, because the impact resistance of the cutting edge 4 can be increased, and the accidental fracture and chipping from the cutting edge 4 can be prevented, and wear resistance can be increased.

The layer thickness of the aluminium oxide layer 7 is preferably set to 1 to 6 μm, especially 2 to 4 μm, because layer peeling can be prevented while retaining wear resistance, and it is easy to adjust the texture coefficient to the set range of the present embodiment.

Furthermore, the surface roughness of an interface 9b between the substrate 5 and the hard coating layer 6 is desirably 0.2 to 1 μm on the rake face 2, and 0.6 to 2 μm on the flank 3. This is because the texture coefficients of the aluminium oxide layer 7 on the rake face 2 and on the flank 3 can be adjusted easily to a predetermined range, and the variations in the texture coefficient in each part of the tool 1 can be prevented to obtain the tool 1 free from variations in performance. The method of measuring the surface roughness on the interface 9b is identical with that described in the foregoing preferred embodiment.

Preferably, a bonding layer 8 composed of a compound containing at least titanium and oxygen is provided immediately below the aluminium oxide layer 7, because the texture coefficient of the aluminium oxide layer 7 can be adjusted easily by adjusting the condition of the bonding layer 8. Also, the adhesion of the aluminium oxide layer 7 can be increased to prevent layer peeling.

Preferably, the bonding layer 8 has an oxygen concentration of 10 to 25 atomic %. This makes it easy to adjust the ratio of the texture coefficient of the aluminium oxide layer 7 to the above-mentioned range, resulting in the tool 1 free from variations in performance.

Preferably, the interface 9c between the aluminium oxide layer 7 and the bonding layer 8 has a surface roughness of 0.2 μm to 0.5 μm on the rake face 2, and a surface roughness of 0.6 μm to 2 μm on the flank 3, because the ratio of the texture coefficient of the aluminium oxide layer 7 can be adjusted easily to the above-mentioned range, resulting in the tool 1 free from variations in performance. The surface roughness of the interface 9c is measured in the same manner as the above-mentioned method of measuring the interface 9b between the substrate 5 and the hard coating layer 6.

In the present embodiment, preferably, the same underlayer 10 as in the first preferred embodiment is formed under the bonding layer 8, and the same uppermost surface layer 11 as in the first preferred embodiment is formed on the uppermost surface of the tool 1. As the substrate 5 of the present embodiment, there are ones similar to those as exemplified in the first preferred embodiment.

In the present embodiment, it is preferable to set so that the adhesion of the aluminium oxide layer 7 on the rake face 2 is in a range of 40 N to 120 N, and the adhesion of the aluminium oxide layer 7 on the flank 3 is in a range of 30 N to 100 N. This is because no peeling of the aluminium oxide layer 7 occurs during continuous cutting, and only the aluminium oxide layer 7 flakes and the underlayer of the aluminium oxide layer 7 remains during interrupted cutting, enabling to maintain sufficient wear resistance even during the interrupted cutting.

The peeling load of the aluminium oxide layer 7 can be determined by, for example, the measurement of adhesion in a scratch test of the aluminium oxide layer 7. Specifically, the scratch test can be conducted by scratching the surface of the aluminium oxide layer 7 of the tool 1 by a diamond indenter under the following conditions.

<Indenter>
Conical diamond indenter (a diamond contact)
Radius: 0.2 mm
Ridge line angle: 120°
<Test Conditions>
Scratch speed: 0.17 mm/sec.
Loading rate: 100 N/min (continuous load) (Provided initial load is adjusted according to peeling load)
Scratching distance: 5 mm
Evaluation: The above-mentioned scratch track is observed with a microscope. At that time, it is specified either (1) the position where the aluminium oxide layer 7 is peeled from the substrate 5 or the surface of the underlayer 10 underlying the substrate 5, namely the position where the aluminium oxide layer 7 starts to flake to expose the substrate 5 or the underlayer 10; or (2) the position where the load of the diamond indenter exceeds the strength of the aluminium oxide layer 7 itself, and the aluminium oxide layer 7 cracks to expose the underlying substrate 5 or the underlayer 10, namely the position where the aluminium oxide layer 7 starts to break to expose the substrate 5 or the underlayer 10. That is, a peeling load ($F_L$), at which the aluminium oxide layer starts to flake, can be given by specifying in the scratch track the position of the boundary between a region where the aluminium oxide layer 7 is exposed, and a region where the underlayer 10 different from the aluminium oxide layer 7, or the substrate 5 is exposed, and calculating the load at this position.

If it is difficult to specify only by the texture observation, the load at which peeling starts can be specified by confirming the component of the element exposed to the surface by Electron probe micro analysis (EPMA) or X-ray photoelectron spectroscopy (XPS), or the like.

A method of manufacturing the surface coated cutting tool according to this preferred embodiment will be described below. First, the substrate 2 is manufactured in the same manner as in the first preferred embodiment described above. Subsequently, in the present embodiment, it is necessary to adjust the surface roughness immediately below the aluminium oxide layer 7 in order to adjust the texture coefficient on the (110) plane of the aluminium oxide layer 7. As a method thereof, first, the surface of the rake face 2 of the substrate 5 is subjected to polishing (grinding) process with elastic grinding stone, brush, lap, blast, barrel tumbling, or the like. Subsequently, a polishing process is separately performed with the above-mentioned method, in order to control so that the surface roughness of the rake face 2 observed on the cross section of the substrate 5 is 0.2 to 1 μm, and the surface roughness of the flank 3 is 0.6 to 2 μm.

Next, the hard coating layer 6 is coated on the surface of the substrate 2 by chemical vapor deposition (CVD) method, for example. First, the underlayer 10 is coated. The underlayer 10 may be formed in the same manner as in the first preferred embodiment described above.

Subsequently, the above-mentioned bonding layer 8 is coated on the surface of the underlayer 10, namely immediately below the aluminium oxide layer 7. For example, when coating a titanium carbonitroxide (TiCNO) layer, there is prepared a mixed gas consisting of 0.1 to 3 vol. % of titanium tetrachloride ($TiCl_4$) gas, 0.1 to 10 vol. % of methane ($CH_4$) gas, 0 to 60 vol. % of nitrogen ($N_2$) gas, carbon dioxide ($CO_2$) gas, and the rest, namely hydrogen ($H_2$) gas. This mixed gas is then infused into the reactor with the interior of the reactor set at temperature of 800 to 1100° C. and 5 to 85 kPa. In the present invention, in order to control the texture coefficients TC on the rake face 2 and the flank 3 of the tool 1 to a predetermined range, it is especially effective to set the $CO_2$ gas in the reaction gas for coating the bonding layer 8, to 2 to 5 vol. %.

Thereafter, an aluminium oxide layer 7 is coated on the surface of the bonding layer 8. The method of forming the aluminium oxide layer 7 may be identical with that in the first preferred embodiment described above. Thus, although the conditions for coating the aluminium oxide layer 7 are similar, the property of the aluminium oxide layer 7 obtained can be changed by changing the condition for coating the bonding layer immediately below the aluminium oxide layer, and the condition for controlling the surface roughness, and the like.

Further, if desired, a titanium nitride (TiN) layer may be coated on the uppermost surface under the above-mentioned conditions, in order to facilitates to ascertain whether the of the cutting edge has been used or not.

Third Preferred Embodiment

A third preferred embodiment of the surface coated cutting tool of the present invention will be described. In this embodiment, the same reference numerals have been used as in the above-mentioned first and second preferred embodiments for identical or similar components, with the description thereof omitted.

The present embodiment has the following characteristic features. That is, the surface of the substrate 5 is provided with at least an aluminium oxide ($Al_2O_3$) layer 7 as a hard coating layer 6, and on the (HKL) plane of the aluminium oxide layer 7, the peak of a (113) plane is the highest. Specifically, the (HKL) plane in the above-mentioned equation (I) is the (113) plane, and in a texture coefficient that can be calculated by substituting, in the equation (I), an X-ray diffraction strength value measured by X-ray diffraction method (XRD) on the (113) plane of the aluminium oxide layer 7, a ratio of a texture coefficient $TC_R$ on a rake face 2 to a texture coefficient $TC_F$ on a flank 3, $TC_F/TC_R$, is in a range of 0.3 to 0.95.

By slight decomposition of the rake face than the flank, the particle size of the aluminium oxide layer on the rake face can be reduced to improve hardness, so that the wear resistance on the rake face can be increased and the toughness of the aluminium oxide layer can also be improved to increase the fracture resistance on the flank subjected to a large impact, thereby preventing the occurrences of large chipping and fracture. Further, by reducing the surface energy on the flank, the wettability of the flank can be lowered to prevent the adhesion of a work material to the flank. As the result, it is possible to prevent both of the crater wear on the rake face, and a degradation in machined surface quality due to the adhesion of the work material on the flank, which become problems in the high-speed continuous cutting process. A particularly desirable range of the ratio $TC_F/TC_R$ is 0.5 to 0.85.

Here, the texture coefficient $TC_R$ of the (113) plane of the aluminium oxide layer 7 on the rake face 2 is 0.4 to 1.0, preferably 0.4 to 0.7, and the texture coefficient $TC_F$ on the flank 3 is 0.2 to 0.7, preferably 0.3 to 0.6. This permits more effective prevention of the crater wear on the rake face 2 and the adhesion of the work material to the flank 3.

Further, the ratio of a texture coefficient $TC_E$ to a texture coefficient $TC_F$ on the (113) plane in a cutting edge 4, $TC_F/TC_E$, is preferably in a range of 0.2 to 0.8, especially 0.4 to 0.7, because the impact resistance of the cutting edge 4 can be increased, and the accidental fracture and chipping from the cutting edge 4 can be prevented, and at the same time, high wear resistance is achievable.

The layer thickness of the aluminium oxide layer 7 is preferably set to 1 to 6 μm, especially 2 to 4 μm, because layer peeling can be prevented while retaining wear resistance, and it is easy to adjust the texture coefficient to the set range of the present embodiment.

Preferably, a bonding layer 8 composed of a compound containing at least titanium and oxygen is provided immediately below the aluminium oxide layer 7. This enables the crystalline structure of the aluminium oxide layer 7 to be controlled to α (alpha)-aluminium oxide structure. Further, the texture coefficient of the aluminium oxide layer 7 can be adjusted easily by adjusting the condition of the bonding layer 8. Also, the adhesion of the aluminium oxide layer 7 can be increased to prevent layer peeling.

Preferably, the oxygen concentration within the bonding layer 8 is 25 to 40 atomic %. This is because it is easy to adjust the ratio of the texture coefficient of the aluminium oxide layer 7 to the above-mentioned range, resulting in the tool 1 free from variations in performance.

In the present embodiment, preferably, the same underlayer 10 as in the foregoing preferred embodiments is coated under the bonding layer 8, and the same uppermost surface layer 11 as in the foregoing preferred embodiments is coated on the uppermost surface of the tool 1. As the substrate 5 of the present embodiment, there are ones similar to those as exemplified in the foregoing preferred embodiments.

Next, a method of manufacturing the surface coated cutting tool according to this preferred embodiment will be described below. First, the substrate 2 is manufactured in the same manner as in the first preferred embodiment described above. Subsequently, in the present embodiment, it is necessary to adjust the surface roughness immediately below the aluminium oxide layer 7 in order to adjust the texture coefficient on the (113) plane of the aluminium oxide layer 7. As a method thereof, first, the surface of the rake face 2 of the substrate 5 is subjected to polishing (grinding) process with elastic grinding stone, brush, lap, blast, barrel tumbling, or the like. Subsequently, a polishing process is separately performed with the above-mentioned method, in order to control so that the surface roughness of the rake face 2 observed on the cross section of the substrate 5 is 0.05 to 0.7 μm, and the surface roughness of the flank 3 is 0.4 to 1.5 μm.

Subsequently, the hard coating layer 6 is formed on the surface of the substrate 2 by chemical vapor deposition (CVD) method, for example. First, the underlayer 10 is coated. The underlayer 10 may be formed in the same manner as in the first preferred embodiment described above.

Subsequently, the above-mentioned bonding layer 8 is coated on the surface of the underlayer 10, namely immediately below the aluminium oxide layer 7. For example, when coating a titanium carbonitroxide (TiCNO) layer, there is prepared a mixed gas consisting of 0.1 to 3 vol. % of titanium tetrachloride ($TiCl_4$) gas, 0.1 to 10 vol. % of methane ($CH_4$) gas, 0 to 60 vol. % of nitrogen ($N_2$) gas, carbon dioxide ($CO_2$) gas, and the rest, namely hydrogen ($H_2$) gas. This mixed gas is then infused into the reactor with the interior of the reactor set at temperature of 800 to 1100° C. and 5 to 85 kPa. In the present invention, in order to control the texture coefficient TC on the rake face 2 and the flank 3 of the tool 1 to a predetermined range, it is especially effective to set the $CO_2$ gas in the reaction gas for coating the bonding layer 8, to 5 to 8 vol. %.

Thereafter, an aluminium oxide layer 7 is coated on the surface of the bonding layer 8. The method of coating the aluminium oxide layer 7 may be identical with that in the first preferred embodiment described above. Further, if desired, a titanium nitride (TiN) layer may be coated on the uppermost surface under the above-mentioned conditions, in order to facilitates to ascertain whether the cutting edge has been used or not.

<Manufacturing Method of Work Piece>

A method of manufacturing a work piece in the present invention will next be described. The method of manufacturing a work piece in the present invention is to perform a cutting process by applying a cutting edge formed at a crossed ridge line part between a rake face and a flank of the surface coated cutting tool, to a work material. Thus, the work piece each having a superior machined surface can be obtained stably.

Preferably, the above-mentioned cutting process includes a high-speed continuous cutting process step. When this step is included, it is preferable to use the tool in which the (HKL) plane is the (113) plane, namely the tool as described above in the third preferred embodiment.

In general, as the texture of the (113) plane is stronger, the particles forming aluminium oxide are finer. Hence, the mechanical characteristics such as hardness, toughness, and the like of the aluminium oxide layer can be improved, and it is therefore possible to improve wear resistance and prevent damages such as fine chipping. Further, by weakening the texture of the (113) plane on the flank than the rake face, the surface energy of the aluminium oxide layer on the flank can be lowered, and the reaction with a work material is hard to occur, thereby preventing the adhesion of the work material, and preventing a degradation in machined surface quality of the work material. That is, the tool of the third preferred embodiment is capable of preventing the crater wear and fine chipping on the rake face, as well as the adhesion of the work material to the flank, which are liable to become problems in the high-speed continuous cutting process having a cutting speed of 200 m or more.

Preferably, the above-mentioned cutting process includes an interrupted cutting process step. When this step is included, it is preferable to use the tool in which the (HKL) plane is the (110) plane, namely the tool as described above in the second preferred embodiment.

In general, as the texture of the (110) plane is stronger, fine cracks are apt to occur in the surface of the aluminium oxide layer. By adapting so that the rake face has more fine cracks than the flank, it is possible to improve the fracture resistance on the rake face that is susceptible to a larger impact by the interrupted cutting, and also prevent the adhesion on the flank.

Preferably, the above-mentioned cutting process includes a continuous cutting step and an interrupted cutting process step. When these step are included, it is preferable to use the tool in which the (HKL) plane is the (012) plane, namely the tool as described above in the first preferred embodiment.

In general, as the texture of the (012) plane is stronger, the toughness of the layer is improved, and, as the texture of the (012) plane is weaker, the hardness of the layer is improved. By adapting so that the rake face has higher toughness than the flank, it is possible to improve the fracture resistance on the rake face that is susceptible to a larger impact by the interrupted cutting, and also prevent the wear on the flank that is apt to wear by the continuous cutting.

Although the foregoing preferred embodiments have described the cases where the (HKL) plane of the aluminium oxide layer is the (012) plane, the (110) plane, or the (113) plane, the (HKL) plane of the aluminium oxide layer in the present invention is not limited to these, and it may be one selected from the (012), (104), (110), (113), (024), and (116) planes.

Although the foregoing preferred embodiments have described that the hard coating layer 6 containing the aluminium oxide layer 7 is coated by chemical vapor deposition (CVD) method, the present invention is not limited to this, and the hard coating layer 6 may be coated by other method such as physical vapor deposition (PVD) method.

Example I

Manufacturing of Surface Coated Cutting Tool

To tungsten carbide (WC) powder having a mean particle size of 1.5 μm, 6 mass % of metal cobalt (Co) powder having a mean particle size of 1.2 μm, 0.5 mass % of titanium carbide (TiC) powder having a mean particle size of 2.0 μm, and 5 mass % of Tantalum carbide (TaC) powder were added and mixed, followed by press molding into a cutting tool shape (CNMA120412). This was then subjected to dewaxing process, and sintered in vacuum of 0.01 Pa at 1500° C. for one hour, thereby manufacturing cemented carbide. The cemented carbide was further subjected to cutting edge treatment (honing R) from the rake face by brushing so that the substrate had the surface roughness as shown in Table 2. The flank 3 was also controlled so that the surface roughness in the observation of the cross section of the tool was in the range shown in Table 2.

Then, on this cemented carbide, various coating layers composed of a multilayer of layers having the compositions as shown in Table 2 was coated by chemical vapor deposition (CVD) method, thereby manufacturing the surface coated cutting tools of Sample Nos. I-1 to I-9 as shown in Table 2. The conditions of coating the respective layers in Table 2 are indicated in Table 1.

TABLE 1

| Hard coating layer | Mixed gas composition (% by volume) | Temperature (° C.) | Pressure (kPa) |
| --- | --- | --- | --- |
| Under layer (TiN) | $TiCl_4$: 0.5, $N_2$: 33, $H_2$: the rest | 900 | 16 |
| TiCN | $TiCl_4$: 1.0, $N_2$: 43, $CH_3CN$: 0.3, $H_2$: the rest | 865 | 9 |
| TiCNO1 | $TiCl_4$: 0.7, $CH_4$: 4, $N_2$: 5, $CO_2$: 1.0, $H_2$: the rest | 1010 | 10 |
| TiCO | $TiCl_4$: 0.7, $CH_4$: 4, $CO_2$: 1.2, $H_2$: the rest | 1010 | 10 |
| TiNO | $TiCl_4$: 0.7, $CH_4$: 4, $N_2$: 5, $CO_2$: 1.1, $H_2$: the rest | 1010 | 10 |
| TiCNO2 | $TiCl_4$: 0.7, $CH_4$: 5, $N_2$: 5, $CO_2$: 0.01, $H_2$: the rest | 1000 | 9 |
| TiCNO3 | $TiCl_4$: 0.7, $CH_4$: 5, $N_2$: 5, $CO_2$: 0.2, $H_2$: the rest | 1000 | 9 |
| $\alpha$-$Al_2O_3$ | $AlCl_3$: 15, HCl: 2, $CO_2$: 4, $H_2S$: 0.01, $H_2$: the rest | 1005 | 6 |
| $\alpha$ + $\kappa$-$Al_2O_3$ | $AlCl_3$: 15, HCl: 2, $CO_2$: 4, $H_2S$: 0.01, $H_2$: the rest | 1005 | 6 |
| Surface layer (TiN) | $TiCl_4$: 0.5, $N_2$: 44, $H_2$: the rest | 1010 | 80 |

In each of the obtained tools (Samples Nos. I-1 to I-9 in Table 2), the X-ray diffraction strength of the hard coating layer was measured at discretionary three locations on the flat surfaces of the rake face and the flank, respectively, by X-ray diffraction analysis (XRD) with CuK α (alpha) rays. The lattice plane peak of the aluminium oxide layer in the results of the measurements were respectively substituted in the above-mentioned equation (I). Then, the texture coefficient $TC_R$ of the (012) plane of the aluminium oxide layer on the rake face of the tool, and the texture coefficient $TC_F$ of the (012) plane of the aluminium oxide layer were calculated as an average value of the three locations, and its ratio $TC_F/TC_R$ was found. The results are presented in Table 2.

Further, the X-ray peak at the cutting edge was determined by micro-X-ray diffraction analysis measurement in which X-rays were irradiated to the cutting edge at the mid-portion of a nose R of the tool and from an angle of 45° with respect to a seating plane. Then, the texture coefficient $TC_E$ of the (012) plane of the aluminium oxide layer in the cutting edge was calculated to find a $TC_F/TC_E$. The results are presented in Table 2.

The surface roughness of each substrate was determined by observing the interface between the fracture surface and the hard coating layer of each of the obtained tools, at magnifications of ×15000 with a scanning electron microscope (SEM). Specifically, as shown in FIG. 3, in the interface between the substrate and the hard coating layer, A is a line passing through the highest convex portion H where the substrate projects uppermost, and being substantially parallel to the substrate; and B is a line passing through the deepest concave portion L where the substrate recesses most deeply, and being substantially parallel to the substrate. A reference line C is a line passing through a midpoint of the shortest distance h between the two lines A and B, and being parallel to the substrate. In the interface between the substrate and the hard coating layer, the shortest distance between the reference line and the highest portion of a rolling mountain or the deepest portion of a valley were measured for each mountain and each valley. The average value of the distances was employed as a surface roughness of the substrate. In the above-mentioned method, the surface roughness of the substrate was measured at five locations on the rake face and the flank, respectively, and its average value was calculated per sample. The results are presented in Table 2.

Further, the layer hardness of the aluminium oxide layer on each of the rake face and the flank, to which a load of 25 g was indented, was measured five times by using a micro Vickers hardness testing machine, and its average value was found. The results are presented in Table 2.

<Evaluations of Wear Resistance and Fracture Resistance>

To evaluate wear resistance and fracture resistance, a continuous cutting test and an interrupted cutting test of the tools (Samples Nos. I-1 to I-9 in Table 2) were conducted under the following conditions. The results are presented in Table 3.

(Continuous Cutting Conditions)
Work material: Ductile cast iron sleeve material with four grooves (FCD700)
Tool shape: CNMA120412
Cutting speed: 250 m/min
Feed rate: 0.4 mm/rev
Depth of cut: 2 mm
Cutting time: 20 minutes
Others: Use of water soluble cutting solution
Evaluation item: Flank wear amount and nose wear amount were determined by observing the cutting edge with a microscope.

(Interrupted Cutting Conditions)
Work material: Ductile cast iron sleeve material with four grooves (FCD700)
Tool shape: CNMA120412
Cutting speed: 250 m/min
Feed rate: 0.3 to 0.5 (variations in feed rate) mm/rev
Depth of cut: 2 mm

TABLE 2

| Sample No.[1] | Hard coating layer[2] | | | | | | | $TC_R$ | $TC_F$ | $TC_E$ |
|---|---|---|---|---|---|---|---|---|---|---|
| | Under layer | | | | | $Al_2O_3$ layer | Surface layer | | | |
| | First layer | Second layer | Third layer | Fourth layer | Bonding layer | | | | | |
| I-1 | TiN (0.5) | TiCN (6.0) | TiCN (3.0) | — | TiCNO1 (0.5) | $\alpha$-$Al_2O_3$ (2.0) | TiN (0.2) | 1.4 | 1.0 | 1.6 |
| I-2 | TiN (0.6) | TiCN (3.0) | TiN (0.5) | TiCN (0.8) | TiCO (1) | $\alpha,\kappa$-$Al_2O_3$ (4.0) | TiN (0.5) | 2.6 | 1.2 | 2.8 |
| I-3 | TiN (1) | TiCN (5.0) | — | — | TiNO (0.3) | $\alpha,\kappa$-$Al_2O_3$ (2.0) | TiN (1) | 0.52 | 0.2 | 0.6 |
| I-4 | TiCN (0.5) | TiCN (3.0) | TiCN (4.0) | — | TiCNO1 (0.1) | $\alpha$-$Al_2O_3$ (5.0) | — | 1.2 | 1.0 | 1.5 |
| I-5 | TiN (0.6) | TiCN (4.0) | TiCN (3.0) | — | TiCNO1 (0.3) | $\alpha$-$Al_2O_3$ (2.0) | TiN (1) | 2.0 | 1.0 | 2.1 |
| I-6 | TiCN (1.0) | TiCN (4.0) | TiCN (2.0) | — | TiCO (1) | $\alpha$-$Al_2O_3$ (4.0) | TiN (0.5) | 1.2 | 1.1 | 1.3 |
| *I-7 | TiN (0.6) | TiCN (0.3) | TiCN (3.0) | — | TiCNO2 (0.3) | $\alpha,\kappa$-$Al_2O_3$ (5.0) | — | 1.9 | 1.9 | 2.1 |
| *I-8 | TiCN (0.3) | TiCN (3.0) | — | — | TiCNO3 (0.5) | $\alpha$-$Al_2O_3$ (3.0) | TiN (0.2) | 3.1 | 0.5 | 3.7 |
| *I-9 | TiN (0.6) | TiCN (7.0) | — | — | TiCNO1 (0.5) | $\alpha,\kappa$-$Al_2O_3$ (7.0) | TiN (0.2) | 1.1 | 1.7 | 1.3 |

| Sample No.[1] | $TC_F/TC_R$ | $TC_F/TC_E$ | Oxygen concentration of binder layer (atomic %) | Surface roughness of substrate (μm) | | Surface roughness of interface (μm) | | Layer hardness of $Al_2O_3$ layer (GPa) | |
|---|---|---|---|---|---|---|---|---|---|
| | | | | Rake face | Flank | Rake face | Flank | Rake face | Flank |
| I-1 | 0.71 | 1.40 | 4.0 | 0.05 | 0.30 | 0.03 | 0.21 | 21.0 | 21.6 |
| I-2 | 0.46 | 2.17 | 5.5 | 0.02 | 0.25 | 0.02 | 0.22 | 20.0 | 21.2 |
| I-3 | 0.38 | 2.60 | 9.6 | 0.10 | 0.20 | 0.07 | 0.19 | 22.1 | 22.8 |
| I-4 | 0.83 | 1.20 | 2.3 | 0.06 | 0.27 | 0.03 | 0.18 | 20.2 | 23.1 |
| I-5 | 0.50 | 2.00 | 3.4 | 0.01 | 0.20 | 0.01 | 0.12 | 20.1 | 20.7 |
| I-6 | 0.92 | 1.09 | 7.4 | 0.06 | 0.20 | 0.06 | 0.14 | 20.0 | 21.3 |
| *I-7 | 1.0 | 1.00 | 0.8 | 0.10 | 0.10 | 0.10 | 0.10 | 21.2 | 21.3 |
| *I-8 | 0.16 | 6.20 | 1.3 | 0.001 | 0.50 | 0.001 | 0.45 | 20.5 | 22.0 |
| *I-9 | 1.55 | 0.65 | 2.1 | 0.20 | 0.06 | 0.19 | 0.05 | 22.3 | 20.5 |

[1] Samples marked "*" are out of the scope of the present invention.
[2] ( ) stands for layer thickness. Unit: μm Others: Use of water soluble cutting solution
Evaluation item: The number of impacts to reach fracture:
After 1000 impacts, the peeling state of the coating layer of the cutting edge was observed with a microscope.

TABLE 3

| Sample No.[1] | Wear test: Wear amount (mm) Wear on the flank | Fracture resistance test Number of impacts before fracture (times) | Condition of hard coating layer |
|---|---|---|---|
| I-1 | 0.14 | 5000 | No damage |
| I-2 | 0.22 | 4300 | No damage |
| I-3 | 0.20 | 4000 | No damage |
| I-4 | 0.12 | 4700 | No damage |
| I-5 | 0.19 | 4700 | No damage |
| I-6 | 0.17 | 4500 | No damage |
| *I-7 | 0.35 | 1100 | Large chipping (Expose the substrate) |
| *I-8 | 0.40 | 2500 | $Al_2O_3$ layer peeling on the rake face |
| *I-9 | 0.29 | 1700 | $Al_2O_3$ layer peeling on the flank |

[1]Samples marked "*" are out of the scope of the present invention.

From Tables 1 to 3, Samples Nos. I-7 and I-9, whose ratio $TC_F/TC_R$ was over 0.95, were poor in both wear resistance and fracture resistance, resulting in an extremely short tool life. Also, Sample No. I-8, whose ratio $TC_F/TC_R$ was lower than 0.3, caused abnormal wear from the rake face, resulting in a short tool life.

Conversely, Samples Nos. I-1 to I-6, whose ratio $TC_F/TC_R$ was in the range of 0.3 to 0.95, were superior in both wear resistance and fracture resistance, hardly having damage on the cutting edge.

Example II

Manufacturing of Surface Coated Cutting Tool

First, cemented carbide was manufactured in the same manner as in Example 1, and further subjected to cutting edge treatment (honing R) from the rake face by brushing so that the substrate had the surface roughness as shown in Table 5. The flank 3 was also controlled so that the surface roughness in the observation of the cross section of the tool was in the range shown in Table 5.

Then, on this cemented carbide, various coating layers composed of a multilayer of layers having the compositions as shown in Table 5 was coated by chemical vapor deposition (CVD) method, thereby manufacturing the surface coated cutting tools of Sample Nos. II-1 to II-9 as shown in Table 5. The conditions of coating the respective layers in Table 5 are indicated in Table 4.

In each of the obtained tools (Samples Nos. II-1 to II-9 in Table 5), the X-ray diffraction strength of the hard coating layer was measured at arbitrary three locations on the flat surfaces of the rake face and the flank, respectively, by X-ray diffraction analysis (XRD) with CuK α (alpha) rays. The lattice plane peak of the aluminium oxide layer in the results of the measurements were respectively substituted in the above-mentioned equation (I). Then, the texture coefficient $TC_R$ of the (110) plane of the aluminium oxide layer on the rake face of the tool, and the texture coefficient $TC_F$ of the (110) plane of the aluminium oxide layer were calculated as an average value of the three locations, and its ratio $TC_F/TC_R$ was found. The results are presented in Table 5.

The interface between the fracture surface of the substrate and the hard coating layer of each of the obtained tools was observed at magnifications of ×15000 with a scanning electron microscope (SEM), and the surface roughness of each substrate was determined in the same manner as in Example 1. The results are presented in Table 5.

Further, in the sample in which a bonding layer containing titanium and oxygen was formed immediately below the aluminium oxide layer, the oxygen concentration within the bonding layer was determined by EPMA analysis. The results are presented in Table 5.

Further, a scratch test of the rake face and the flank of each of the obtained tools was conducted under the following conditions. By observing the scratch track, the interlayer peeling state, and the load at which the coating layer started to separate from the substrate were confirmed to calculate the adhesion of the aluminium oxide layer.

Apparatus: CSEM-REVETEST manufactured by Nano-tech Co., Ltd.

Measuring Conditions:

Scratch speed: 0.17 mm/sec.

Loading rate: 100 N/min (continuous load)

Scratching distance: 5 mm

Indenter:

Conical diamond indenter (N2-1487, a diamond contact manufactured by Tokyo Diamond Kogu Seisakusho Co., Ltd.)

Radius: 0.2 mm

Ridge line angle: 120°

TABLE 4

| Hard coating layer | Mixed gas composition (% by volume) | Temperature (° C.) | Pressure (kPa) |
|---|---|---|---|
| Under layer (TiN) | $TiCl_4$: 0.5, $N_2$: 33, $H_2$: the rest | 900 | 16 |
| TiCN | $TiCl_4$: 1.0, $N_2$: 43, $CH_3CN$: 0.3, $H_2$: the rest | 865 | 9 |
| TiCNO1 | $TiCl_4$: 1.5, $CH_4$: 5, $N_2$: 11, $CO_2$: 2.0, $H_2$: the rest | 1010 | 10 |
| TiCO | $TiCl_4$: 1.5, $CH_4$: 5, $CO_2$: 2.0, $H_2$: the rest | 1010 | 10 |
| TiNO | $TiCl_4$: 1.5, $CH_4$: 5, $N_2$: 11, $CO_2$: 2.0, $H_2$: the rest | 1010 | 10 |
| TiCNO2 | $TiCl_4$: 1.3, $CH_4$: 5, $N_2$: 10, $CO_2$: 1.0, $H_2$: the rest | 1000 | 9 |
| TiCNO3 | $TiCl_4$: 1.7, $CH_4$: 5, $N_2$: 10, $CO_2$: 0.8, $H_2$: the rest | 1000 | 9 |
| α-$Al_2O_3$ | $AlCl_3$: 18, HCl: 2, $CO_2$: 5, $H_2S$: 0.01, $H_2$: the rest | 1000 | 8 |
| α + κ-$Al_2O_3$ | $AlCl_3$: 18, HCl: 2, $CO_2$: 3, $H_2S$: 0.01, $H_2$: the rest | 960 | 8 |
| Surface layer (TiN) | $TiCl_4$: 0.5, $N_2$: 44, $H_2$: the rest | 1010 | 80 |

TABLE 5

| Sample No.[1] | Hard coating layer[2] Under layer | | | | Hard coating layer[2] Bonding layer | Hard coating layer[2] Al₂O₃ layer | Hard coating layer[2] Surface layer | Oxygen concentration of binder layer (atomic %) | $TC_R$ | $TC_F$ | $TC_F/TC_R$ | Surface roughness of substrate (μm) Rake face | Surface roughness of substrate (μm) Flank | Surface roughness of interface (μm) Rake face | Surface roughness of interface (μm) Flank | Adhesion of Al₂O₃ layer (N) Rake face | Adhesion of Al₂O₃ layer (N) Flank |
|---|---|---|---|---|---|---|---|---|---|---|---|---|---|---|---|---|---|
| | First layer | Second layer | Third layer | Fourth layer | | | | | | | | | | | | | |
| II-1 | TiN (0.5) | TiCN (4.0) | TiCN (2.0) | — | TiCNO1 (0.5) | α-Al₂O₃ (1.5) | TiN (0.2) | 15 | 4.1 | 3.2 | 0.78 | 0.33 | 0.60 | 0.25 | 0.50 | 82.0 | 51.0 |
| II-2 | TiN (0.6) | TiCN (6.0) | — | — | TiNO (0.1) | α-Al₂O₃ (3.0) | TiN (0.5) | 20 | 2.4 | 0.8 | 0.33 | 0.62 | 1.20 | 0.54 | 1.02 | 94.0 | 68.0 |
| II-3 | TiN (1) | TiCN (3.0) | TiCN (4.0) | — | TiCO (0.3) | α + κ-Al₂O₃ (2.0) | TiN (1) | 18 | 1.3 | 0.5 | 0.38 | 1.10 | 1.80 | 1.00 | 1.47 | 98.0 | 71.0 |
| II-4 | TiN (0.1) | TiCN (7.5) | — | — | TiCNO1 (0.1) | α-Al₂O₃ (3.0) | — | 13 | 2.5 | 1.3 | 0.52 | 0.67 | 1.00 | 0.33 | 0.82 | 65.0 | 48.0 |
| II-5 | TiCN (4.0) | TiCN (3.0) | TiN (0.5) | — | TiCNO1 (0.3) | α + κ-Al₂O₃ (2.0) | TiN (1) | 12 | 4.9 | 3.5 | 0.71 | 0.20 | 0.40 | 0.09 | 0.31 | 79.0 | 54.0 |
| II-6 | TiCN (1.0) | TiCN (4.0) | TiCN (2.0) | TiN (0.5) | TiCO (1) | α-Al₂O₃ (4.0) | TiN (0.5) | 17 | 1.2 | 1.1 | 0.92 | 1.10 | 1.13 | 0.91 | 0.98 | 76.0 | 50.0 |
| *II-7 | TiN (0.6) | TiCN (0.3) | TiCN (3.0) | — | TiCNO3 (0.3) | α + κ-Al₂O₃ (2.0) | — | 2 | 1.9 | 1.85 | 0.97 | 1.30 | 1.31 | 1.01 | 1.00 | 100.0 | 112.0 |
| *II-8 | TiCN (0.3) | TiCN (3.0) | — | — | TiCNO2 (0.5) | α-Al₂O₃ (3.0) | TiN (0.2) | 3 | 3.1 | 0.5 | 0.16 | 0.30 | 1.50 | 0.24 | 1.06 | 38.0 | 21.0 |
| *II-9 | TiN (0.6) | TiCN (7.0) | — | — | TiCNO1 (0.5) | α-Al₂O₃ (7.0) | TiN (0.2) | 18 | 1.1 | 1.7 | 1.55 | 1.00 | 0.70 | 0.83 | 0.47 | 24.0 | 39.0 |

[1] Samples marked "*" are out of the scope of the present invention.
[2] ( ) stands for layer thickness. Unit: μm <Evaluations of Wear Resistance and Fracture Resistance>

To evaluate wear resistance and fracture resistance, a continuous cutting test and an interrupted cutting test of the tools (Samples Nos. II-1 to II-9 in Table 5) were conducted under the following conditions. The results are presented in Table 6.

(Continuous Cutting Conditions)
Work material: Ductile cast iron sleeve (FCD700)
Tool shape: CNMA120412
Cutting speed: 350 m/min
Feed rate: 0.4 mm/rev
Depth of cut: 2.5 mm
Cutting time: 20 minutes
Others: Use of water soluble cutting solution
Evaluation item: Flank wear amount and nose wear amount were determined by observing the cutting edge with a microscope.

(Interrupted Cutting Conditions)
Work material: Ductile cast iron sleeve with four grooves (FCD700)
Tool shape: CNMA120412
Cutting speed: 150 m/min
Feed rate: 0.3 to 0.5 (variations in feed amount) mm/rev
Depth of cut: 2 mm
Others: Use of water soluble cutting solution
Evaluation item: The number of impacts to reach fracture: After 1000 impacts, the peeling state of the coating layer of the cutting edge was observed with a microscope.

TABLE 6

| Sample No.[1] | Wear test: Wear amount (mm) Wear on the flank | Fracture resistance test Number of impacts before fracture (times) | Condition of hard coating layer |
|---|---|---|---|
| II-1 | 0.20 | 6000 | No damage |
| II-2 | 0.25 | 5000 | No damage |
| II-3 | 0.15 | 3800 | No damage |
| II-4 | 0.18 | 4800 | No damage |
| II-5 | 0.30 | 5900 | No damage |
| II-6 | 0.19 | 3800 | No damage |

TABLE 6-continued

| Sample No.[1] | Wear test: Wear amount (mm) Wear on the flank | Fracture resistance test Number of impacts before fracture (times) | Condition of hard coating layer |
|---|---|---|---|
| *II-7 | 0.45 | 1100 | Adhesion, Chipping |
| *II-8 | 0.50 | 1700 | Al₂O₃ layer peeling on the flank |
| *II-9 | 0.39 | 1200 | Al₂O₃ layer peeling on the rake face |

[1] Samples marked "*" are out of the scope of the present invention.

From Tables 4 to 6, Samples Nos. II-7 and II-9, whose ratio $TC_F/TC_R$ was over 0.95, were poor in both wear resistance and fracture resistance, resulting in an extremely short tool life. Also, Sample No. II-8, whose ratio $TC_F/TC_R$ was lower than 0.3, caused abnormal wear from the rake face, resulting in a short tool life.

Conversely, Samples Nos. II-1 to II-6, whose ratio $TC_F/TC_R$ was in the range of 0.3 to 0.95, were superior in both wear resistance and fracture resistance, hardly having damage on the cutting edge.

Example III

Manufacturing of Surface Coated Cutting Tool

First, cemented carbide was manufactured in the same manner as in Example 1, and further subjected to cutting edge treatment (honing R) from the rake face by brushing so that the substrate had the surface roughness as shown in Table 8. The flank 3 was also controlled so that the surface roughness in the observation of the cross section of the tool was in the range shown in Table 8.

Then, on this cemented carbide, various coating layers composed of a multilayer of layers having the compositions as shown in Table 8 was coated by chemical vapor deposition (CVD) method, thereby manufacturing the surface coated cutting tools of Sample Nos. III-1 to III-9 as shown in Table 8. The conditions of forming the respective layers in Table 8 are indicated in Table 7.

TABLE 7

| Hard coating layer | Mixed gas composition (% by volume) | Temperature (° C.) | Pressure (kPa) |
|---|---|---|---|
| Under layer (TiN) | $TiCl_4$: 0.5, $N_2$: 33, $H_2$: the rest | 900 | 16 |
| TiCN | $TiCl_4$: 1.0, $N_2$: 43, $CH_3CN$: 0.3, $H_2$: the rest | 865 | 9 |
| TiCNO1 | $TiCl_4$: 1.5, $CH_4$: 5, $2N_2$: 11, $CO_2$: 5.0, $H_2$: The rest | 1010 | 10 |
| TiCO | $TiCl_4$: 1.5, $CH_4$: 5, $CO_2$: 5.0, $H_2$: the rest | 1010 | 10 |
| TiNO | $TiCl_4$: 1.5, $CH_4$: 5, $N_2$: 11, $CO_2$: 5.0, $H_2$: the rest | 1010 | 10 |
| TiCNO2 | $TiCl_4$: 1.3, $CH_4$: 5, $N_2$: 10, $CO_2$: 7.0, $H_2$: the rest | 1000 | 9 |
| TiNO3 | $TiCl_4$: 1.7, $CH_4$: 5, $N_2$: 10, $CO_2$: 2.0, $H_2$: the rest | 1000 | 9 |
| $\alpha$-$Al_2O_3$ | $AlCl_3$: 18, HCl: 2, $CO_2$: 7, $H_2S$: 0.01, $H_2$: the rest | 1010 | 6 |
| $\alpha$ + $\kappa$-$Al_2O_3$ | $AlCl_3$: 18, HCl: 2, $CO_2$: 3, $H_2S$: 0.01, $H_2$: the rest | 990 | 8 |
| Surface layer (TiN) | $TiCl_4$: 0.5, $N_2$: 44, $H_2$: the rest | 1010 | 80 |

In each of the obtained tools (Samples Nos. III-1 to III-9 in Table 8), the X-ray diffraction strength of the hard coating layer was measured at arbitrary three locations on the flat surfaces of the rake face and the flank, respectively, by X-ray diffraction analysis (XRD) with CuK α (alpha) rays. The lattice plane peak of the aluminium oxide layer in the results of the measurements were respectively substituted in the above-mentioned equation (I). Then, the texture coefficient $TC_R$ of the (113) plane of the aluminium oxide layer on the rake face of the tool, and the texture coefficient $TC_F$ of the (113) plane of the aluminium oxide layer were calculated as an average value of the three locations, and its ratio $TC_F/TC_R$ was found. The results are presented in Table 8.

The interface between the fracture surface of the substrate and the hard coating layer of each of the obtained tools was observed at magnifications of ×15000 with a scanning electron microscope (SEM), and the surface roughness of each substrate was determined in the same manner as in Example 1. The results are present in Table 8.

Further, in the sample in which a bonding layer containing titanium and oxygen was coated immediately below the aluminium oxide layer, the oxygen concentration within the bonding layer was determined by EPMA analysis. The results are presented in Table 8.

<Evaluations of Wear Resistance and Fracture Resistance>

To evaluate wear resistance and fracture resistance, a continuous cutting test and an interrupted cutting test of the tools (Samples Nos. III-1 to III-9 in Table 8) were conducted under the following conditions. The results are presented in Table 9.

(Continuous Cutting Conditions)
Work material: Carbon steel round bar (S45C)
Tool shape: CNMG120408
Cutting speed: 400 m/min
Feed rate: 0.3 mm/rev
Depth of cut: 1.5 mm
Cutting time: 20 minutes
Others: Dry cutting
Evaluation item: Flank wear amount and nose wear amount were determined by observing the cutting edge with a microscope.

(Interrupted Cutting Conditions)
Work material: Carbon steel round bar with four grooves (S45C)
Tool shape: CNMG120408
Cutting speed: 250 m/min
Feed rate: 0.3 to 0.5 (variations in feed amount) mm/rev
Depth of cut: 2 mm
Others: Dry cutting

TABLE 8

| | Hard coating layer[2] | | | | | | | Oxygen concentration of binder layer (atomic %) | $TC_R$ | $TC_F$ | $TC_F/TC_R$ | Surface roughness of substrate (μm) | | Surface roughness of interface (μm) | |
|---|---|---|---|---|---|---|---|---|---|---|---|---|---|---|---|
| | Under layer | | | | Bonding layer | $Al_2O_3$ layer | Surface layer | | | | | Rake face | Flank | Rake face | Flank |
| Sample No.[1] | First layer | Second layer | Third layer | Fourth layer | | | | | | | | | | | |
| III-1 | TiN (0.1) | TiCN (5.0) | TiCN (3.0) | — | TiCNO1 (0.5) | $\alpha$-$Al_2O_3$ (4.0) | TiN (0.3) | 30 | 0.6 | 0.3 | 0.50 | 0.45 | 0.70 | 0.37 | 0.60 |
| III-2 | TiN (0.3) | TiCN (7.0) | — | — | TiNO (0.1) | $\alpha$ + $\kappa$-$Al_2O_3$ (5.0) | TiN (0.3) | 40 | 1.0 | 0.7 | 0.70 | 0.07 | 0.40 | 0.08 | 0.30 |
| III-3 | TiN (0.5) | TiCN (5.0) | — | — | TiCO (0.3) | $\alpha$-$Al_2O_3$ (7.0) | TiN (0.5) | 25 | 0.4 | 0.2 | 0.50 | 0.70 | 1.47 | 0.63 | 1.10 |
| III-4 | TiN (0.5) | TiCN (3.5) | TiCN (3.0) | TiCN (2.5) | TiCNO1 (0.1) | $\alpha$-$Al_2O_3$ (3.0) | TiN (0.2) | 37 | 0.9 | 0.3 | 0.33 | 0.10 | 0.68 | 0.10 | 0.61 |
| III-5 | TiCN (3.0) | TiN (1.0) | TiCN (3.0) | — | TiCNO1 (0.3) | $\alpha$ + $\kappa$-$Al_2O_3$ (3.5) | — | 34 | 0.8 | 0.7 | 0.88 | 0.23 | 0.40 | 0.15 | 0.32 |
| III-6 | TiCN (1.0) | TiCN (4.0) | TiCN (2.0) | | TiCO (1) | $\alpha$-$Al_2O_3$ (4.5) | TiN (1.0) | 27 | 0.5 | 0.4 | 0.80 | 0.49 | 0.57 | 0.36 | 0.50 |
| *III-7 | TiN (0.2) | TiCN (7.0) | TiN (2.0) | — | TiCNO3 (0.3) | $\alpha$-$Al_2O_3$ (3.0) | TiN (0.5) | 6 | 0.3 | 0.3 | 1.00 | 0.78 | 0.77 | 0.64 | 0.64 |
| *III-8 | TiCN (0.5) | TiCN (5.0) | — | — | TiCNO2 (0.5) | $\alpha$-$Al_2O_3$ (1.5) | — | 21 | 0.9 | 0.2 | 0.22 | 0.30 | 1.60 | 0.220 | 1.30 |
| *III-9 | TiN (0.1) | TiCN (5.0) | — | — | TiCNO1 (0.5) | $\alpha$ + $\kappa$-$Al_2O_3$ (6.0) | TiN (1.0) | 50 | 1.1 | 1.7 | 1.55 | 0.04 | 0.01 | 0.03 | 0.01 |

[1] Samples marked "*" are out of the scope of the present invention.
[2] ( ) stands for layer thickness. Unit: μm Evaluation item: The number of impacts to reach fracture:
After 1000 impacts, the peeling state of the coating layer of the cutting edge was observed with a microscope.

TABLE 9

| Sample No.[1] | Wear test: Wear amount (mm) Wear on the flank | Fracture resistance test Number of impacts before fracture (times) | Condition of hard coating layer |
|---|---|---|---|
| III-1 | 0.12 | 4500 | No damage |
| III-2 | 0.16 | 4200 | No damage |
| III-3 | 0.14 | 3900 | No damage |
| III-4 | 0.17 | 4200 | No damage |
| III-5 | 0.17 | 4000 | No damage |
| III-6 | 0.19 | 4500 | No damage |
| *III-7 | 0.34 | 1300 | Layer peeling, Chipping |
| *III-8 | 0.39 | 2000 | Layer peeling |
| *III-9 | 0.31 | 1600 | Chipping |

[1]Samples marked "*" are out of the scope of the present invention.

From Tables 7 to 9, Samples Nos. III-7 and III-9, whose ratio $TC_F/TC_R$ was over 0.95, were poor in both wear resistance and fracture resistance, resulting in an extremely short tool life. Also, Sample No. III-8, whose ratio $TC_F/TC_R$ was lower than 0.3, caused abnormal wear from the rake face, resulting in a short tool life.

Conversely, Samples Nos. III-1 to III-6, whose ratio $TC_F/TC_R$ was in the range of 0.3 to 0.95, were superior in both wear resistance and fracture resistance, hardly having damage on the cutting edge.

The invention claimed is:

1. A surface coated cutting tool having, on a surface of a substrate, a hard coating layer including at least an aluminium oxide layer, the surface having a rake face on a main face thereof and a flank on a side face thereof, wherein, when a value calculated by the following equation (I) is a texture coefficient TC of an (HKL) plane of the aluminium oxide layer, a ratio of a texture coefficient $TC_R$ on the rake face to a texture coefficient $TC_F$ on the flank, $TC_F/TC_R$, is in a range of 0.3 to 0.95

$$TC = \frac{I(HKL)/I_O(HKL)}{1/6 \sum [I(hkl)/I_0(hkl)]} \quad (I)$$

where,
(HKL) plane is one selected from (012), (104), (110), (113), (024), and (116) planes;
I(HKL) is a measured value of an X-ray diffraction peak on the (HKL) plane;
$I_0$(HKL) is a standard X-ray diffraction peak on the (HKL) plane of a JCPDS card number 10-173; and
$\Sigma[I(hkl)/I_0(hkl)]$ is a sum of values of [Measured value of X-ray diffraction peak]/[Standard X-ray diffraction peak] on the (012), (104), (110), (113), (024), and (116) planes.

2. The surface coated cutting tool according to claim 1, wherein the (HKL) plane is (012) plane.

3. The surface coated cutting tool according to claim 2, wherein a texture coefficient $TC_R$ on the rake face is 1.2 to 2.5, and a texture coefficient $TC_F$ on the flank is 0.5 to 1.1.

4. The surface coated cutting tool according to claim 2, wherein the surface of the substrate has a surface roughness of 0.1 μm or less on the rake face, and a surface roughness of 0.2 to 1.0 μm on the flank.

5. The surface coated cutting tool according to claim 2, wherein a bonding layer composed of a compound containing at least titanium and oxygen is provided immediately below the aluminium oxide layer.

6. The surface coated cutting tool according to claim 5, wherein the bonding layer has an oxygen concentration of 2 to 10 atomic %.

7. The surface coated cutting tool according to claim 5, wherein an interface between the aluminium oxide layer and the bonding layer has a surface roughness of 0.08 μm or less on the rake face, and a surface roughness of 0.1 to 0.8 μm on the flank.

8. The surface coated cutting tool according to claim 2, wherein a layer hardness of the aluminium oxide layer measured with a micro Vickers hardness testing machine is 20 GPa or more on the rake face, and a layer hardness of the aluminium oxide layer on the flank is 0.5 GPa greater or more than a layer hardness on the rake face.

9. The surface coated cutting tool according to claim 1, wherein the (HKL) plane is (110) plane.

10. The surface coated cutting tool according to claim 9, wherein a texture coefficient $TC_R$ on the rake face is 1.3 to 5.0, and a texture coefficient $TC_F$ on the flank is 0.5 to 4.0.

11. The surface coated cutting tool according to claim 9, wherein the surface of the substrate has a surface roughness of 0.2 to 1 μm on the rake face, and a surface roughness of 0.6 to 2 μm on the flank.

12. The surface coated cutting tool according to claim 9, wherein a bonding layer composed of a compound containing at least titanium and oxygen is provided immediately below the aluminium oxide layer.

13. The surface coated cutting tool according to claim 12, wherein the bonding layer has an oxygen concentration of 10 to 25 atomic %.

14. The surface coated cutting tool according to claim 12, wherein an interface between the aluminium oxide layer and the bonding layer has a surface roughness of 0.2 to 0.5 μm on the rake face, and a surface roughness of 0.6 to 2 μm on the flank.

15. The surface coated cutting tool according to claim 9, wherein adhesion of the aluminium oxide layer determined by a scratch test with a diamond indenter is in a range of 40 N to 120 N on the rake face, and adhesion of the aluminium oxide layer on the flank is in a range of 30 N to 100 N.

16. The surface coated cutting tool according to claim 1, wherein the (HKL) plane is (113) plane.

17. The surface coated cutting tool according to claim 16, wherein a texture coefficient $TC_R$ on the rake face is 0.4 to 1.0, and a texture coefficient $TC_F$ on the flank is 0.2 to 0.7.

18. The surface coated cutting tool according to claim 16, wherein a bonding layer composed of a compound containing at least titanium and oxygen is provided immediately below the aluminium oxide layer.

19. The surface coated cutting tool according to claim 18, wherein the bonding layer has an oxygen concentration of 25 to 40 atomic %.

20. The surface coated cutting tool according to claim 1, wherein a ratio of a texture coefficient $TC_E$ on the (HKL) plane in a cutting edge formed at a crossed ridge line part between the rake face and the flank, to a texture coefficient $TC_F$ on the flank, $TC_F/TC_E$, is in a range of 0.2 to 0.8.

21. The surface coated cutting tool according to claim 1, wherein the aluminium oxide layer has a layer thickness of 1 to 6 μm.

22. A method of manufacturing a work piece in which a cutting process is performed by applying, to a work material, a cutting edge formed at a crossed ridge line part between the rake face and the flank of the surface coated cutting tool according to claim 1.

23. The method of manufacturing a work piece according to claim 22, wherein the cutting process includes a continuous cutting process step and an interrupted cutting process step.

24. The method of manufacturing a work piece according to claim 23, wherein a cutting process is performed with the surface coated cutting tool wherein the (HKL) plane is (012) plane.

25. The method of manufacturing a work piece according to claim 22, wherein the cutting process includes an interrupted cutting process step.

26. The method of manufacturing a work piece according to claim 25, wherein a cutting process is performed with the surface coated cutting tool wherein the (HKL) plane is (110) plane.

27. The method of manufacturing a work piece according to claim 22, wherein the cutting process includes a high-speed continuous cutting process step.

28. The method of manufacturing a work piece according to claim 27, wherein a cutting process is performed with the surface coated cutting tool wherein the (HKL) plane is (113) plane.

* * * * *